United States Patent [19]
Kapoor

[11] Patent Number: 6,005,264
[45] Date of Patent: Dec. 21, 1999

[54] MICROELECTRONIC INTEGRATED CIRCUIT INCLUDING HEXAGONAL CMOS "NAND" GATE DEVICE

[75] Inventor: Ashok Kapoor, Palo Alto, Calif.

[73] Assignee: LSI Logic Corporation, Milpitas, Calif.

[21] Appl. No.: 08/396,541

[22] Filed: Mar. 1, 1995

[51] Int. Cl.[6] ............................ H01L 27/10; H01L 29/76; H01L 29/94; H01L 31/062

[52] U.S. Cl. .............................................. 257/204; 257/341

[58] Field of Search .................................... 257/341, 204, 257/339

[56] References Cited

U.S. PATENT DOCUMENTS

| | | | |
|---|---|---|---|
| 5,072,266 | 12/1991 | Bulucea et al. | 257/341 |
| 5,130,767 | 7/1992 | Lidow et al. | 357/23.4 |
| 5,198,881 | 3/1993 | Huang et al. | 257/219 |
| 5,323,036 | 6/1994 | Neilson et al. | 257/287 |

OTHER PUBLICATIONS

Chaudhuri, P. Pal, *Routing Multilayer Boards on Steiner Metric*, 1980 IEEE International Symposium on Circuits and Systems Proceedings, vol. 3 of 3, pp. 961–964.

Sedra et al, *Microelectronic Circuits* 1986 pp. 801 and 734.

*Primary Examiner*—Stephen D. Meier
*Attorney, Agent, or Firm*—Mitchell Silberberg & Knupp LLP

[57] ABSTRACT

A microelectronic integrated circuit includes a semiconductor substrate, and a plurality of CMOS microelectronic devices formed on the substrate. Each device includes a hexagonal ANY element of a first conductivity type (PMOS or NMOS), and a hexagonal ALL element of a second conductivity type (NMOS or PMOS), the ANY and ALL elements each having a plurality of inputs and an output that are electrically interconnected respectively. The ANY element is basically an OR element, and the ALL element is basically an AND element. However, the power supply connections and the selection of conductivity type (NMOS or PMOS) for the ANY and ALL elements can be varied to provide the device as having a desired NAND, AND, NOR or OR configuration, in which the ANY element acts as a pull-up and the ALL element acts as a pull-down, or vice-versa.

50 Claims, 10 Drawing Sheets

CMOS NAND

CMOS AND

CMOS NOR

CMOS OR

CMOS NAND

MICROELECTRONIC INTEGRATED CIRCUIT INCLUDING HEXAGONAL CMOS "NAND" GATE DEVICE

BACKGROUND OF THE INVENTION

1. Field of the Invention

The present invention generally relates to the art of microelectronic integrated circuits, and more specifically to a microelectronic integrated circuit including a plurality of hexagonal CMOS "NAND" gate devices.

2. Description of the Related Art

Microelectronic integrated circuits consist of large numbers of semiconductor devices that are fabricated by layering several different materials on a silicon base or wafer. These devices include logic gates that provide AND, OR, NAND, NOR and other binary logic functions. Each device includes a plurality of pins or terminals that are connected to pins of other devices by electrical interconnect wire networks or nets.

As illustrated in FIG. 1, a conventional microelectronic integrated circuit 10 comprises a substrate 12 on which a large number of semiconductor devices are formed. These devices include large functional macroblocks such as indicated at 14 which may be central processing units, input-output devices or the like. A typical integrated circuit further comprises a large number of smaller devices such as logic gates 16 which are arranged in a generally rectangular pattern in the areas of the substrate 12 that are not occupied by macroblocks.

The logic gates 16 have terminals 18 to provide interconnections to other gates 16 on the substrate 12. Interconnections are made via vertical electrical conductors 20 and horizontal electrical conductors 22 that extend between the terminals 18 of the gates 16 in such a manner as to achieve the interconnections required by the netlist of the integrated circuit 10. It will be noted that only a few of the elements 16, 18, 20 and 22 are designated by reference numerals for clarity of illustration.

In conventional integrated circuit design, the electrical conductors 20 and 22 are formed in vertical and horizontal routing channels (not designated) in a rectilinear (Manhattan) pattern. Thus, only two directions for interconnect routing are provided, although several layers of conductors extending in the two orthogonal directions may be provided to increase the space available for routing.

A goal of routing is to minimize the total wirelength of the interconnects, and also to minimize routing congestion. Achievement of this goal is restricted using conventional rectilinear routing because diagonal connections are not possible. A diagonal path between two terminals is shorter than two rectilinear orthogonal paths that would be required to accomplish the same connection.

Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effects.

SUMMARY OF THE INVENTION

In accordance with the present invention, electrical conductors for interconnecting terminals of microelectronic devices of an integrated circuit extend in three directions that are angularly displaced from each other by 60°.

The conductors pass through points defined by centers of closely packed small hexagons superimposed on the substrate such that the conductors extend perpendicular to edges of the hexagons.

The conductors that extend in the three directions can be formed in three different layers, or alternatively the conductors that extend in two or three of the directions can be formed in a single layer as long as they do not cross.

A microelectronic integrated circuit that utilizes the present three direction routing arrangement includes a semiconductor substrate, and a plurality of microelectronic devices that are formed on the substrate in a closely packed hexagonal arrangement that maximizes the space utilization of the circuit.

The present integrated circuit includes a semiconductor substrate, and a plurality of CMOS microelectronic devices formed on the substrate. Each device includes a hexagonal ANY element of a first conductivity type (PMOS or NMOS), and a hexagonal ALL element of a second conductivity type (NMOS or PMOS), the ANY and ALL elements each having a plurality of inputs and an output that are electrically interconnected respectively.

The ANY element is basically an OR element, and the ALL element is basically an AND element. However, the power supply connections and the selection of conductivity type (NMOS or PMOS) for the ANY and ALL elements can be varied to provide the device as having a desired NAND, AND, NOR or OR configuration, in which the ANY element acts as a pull-up and the ALL element acts as a pull-down, or vice-versa.

The present invention substantially reduces the total wirelength interconnect congestion of the integrated circuit by providing three routing directions, rather than two as in the prior art. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
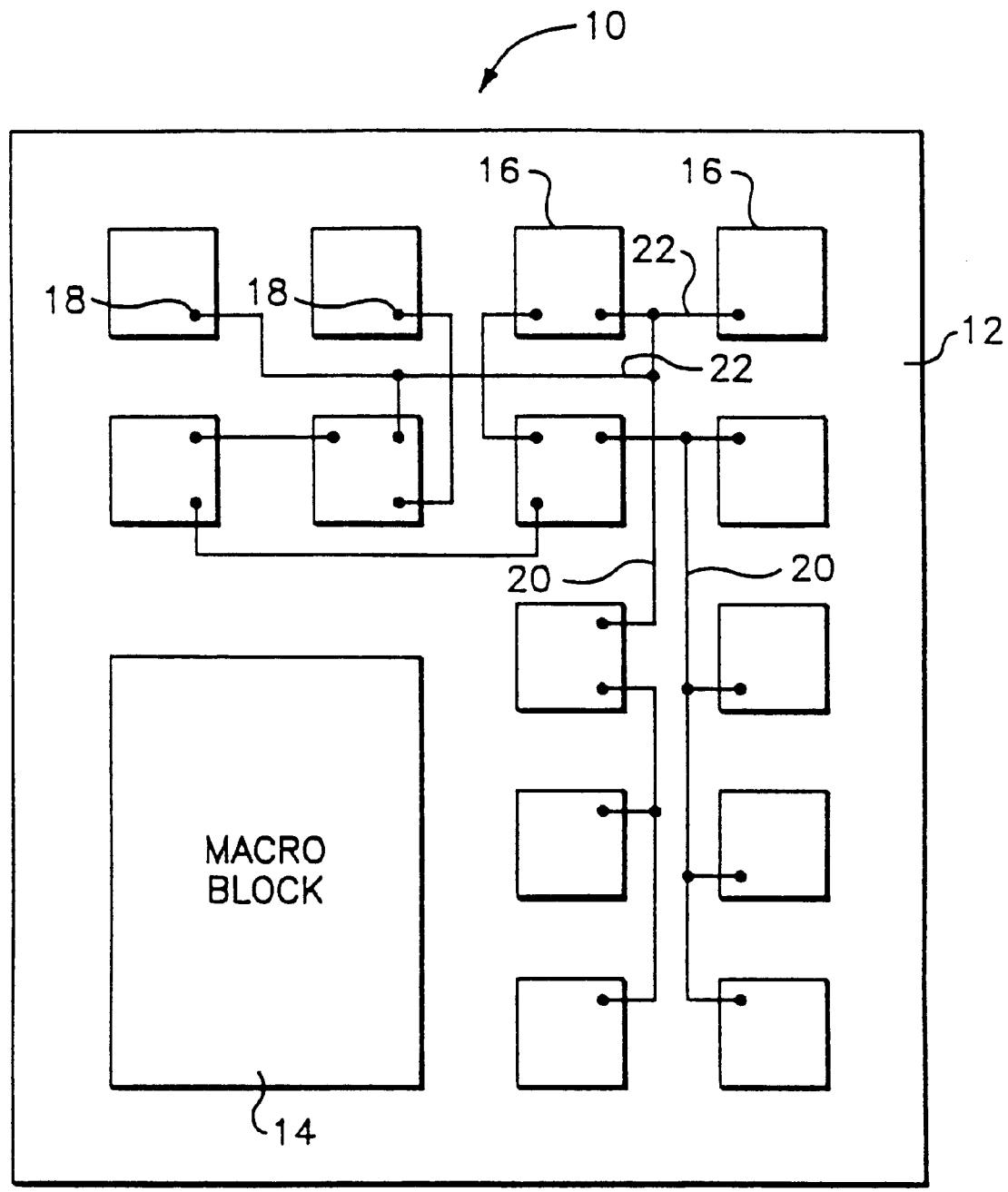
FIG. 1 is a diagram illustrating a prior art integrated circuit.
Figure 2:
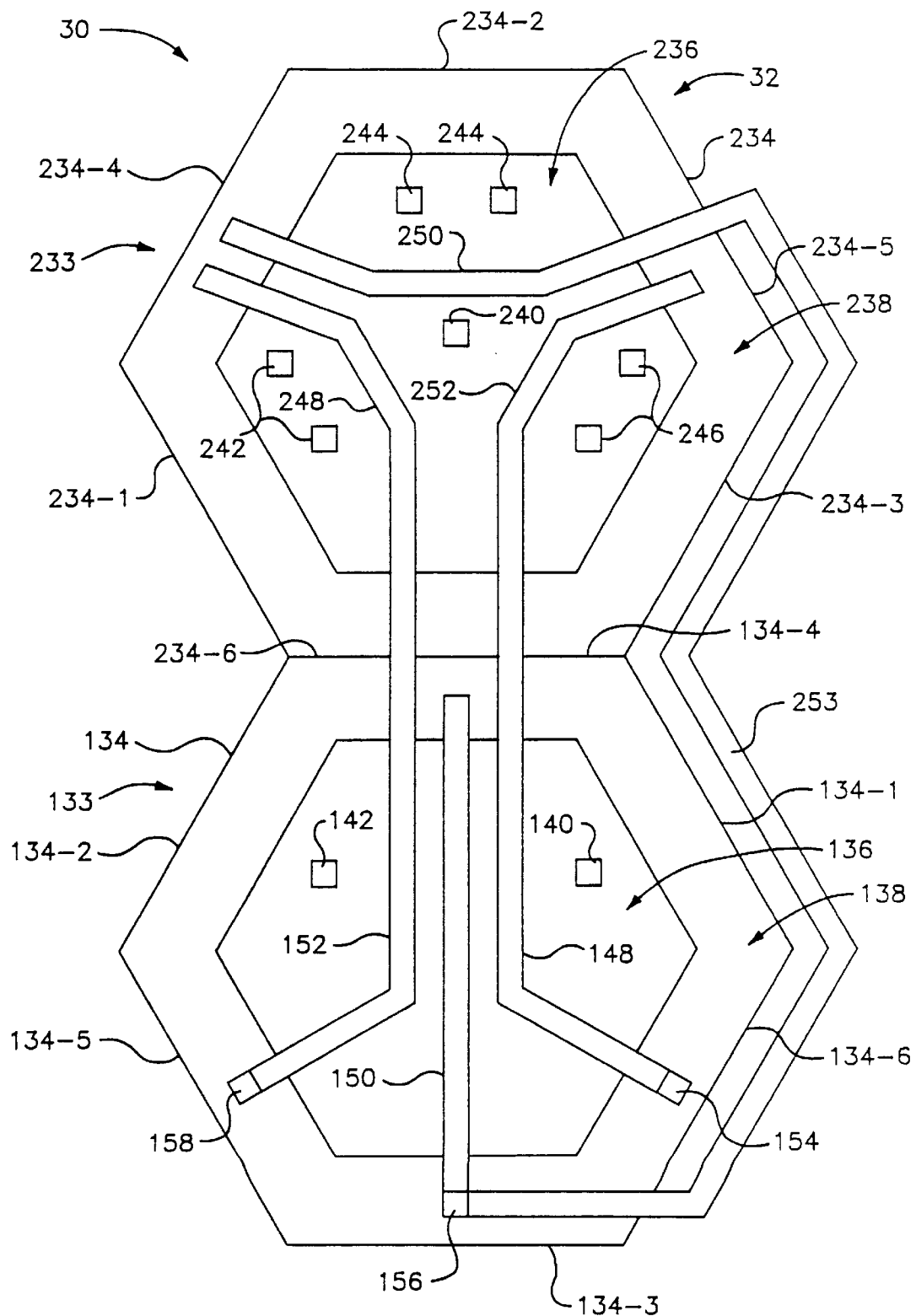
FIG. 2 is a diagram illustrating a microelectronic gate device embodying the present invention.

A semiconductor CMOS gate device for a microelectronic integrated circuit is designated by the reference numeral 30 and illustrated in FIG. 2. The device 30, in its basic form, provides a logical NAND function, but can be adapted to provide a logical AND, NOR, OR or other logical function as will be described below.

The gate device 30 is formed on a substrate 32, and includes a logical "ALL" element 133 having a hexagonal periphery 134 including first to sixth edges 134-1, 134-2, 134-3, 134-4, 134-5 and 134-6 respectively in the illustrated arrangement. A hexagonal semiconductor active area 136 is formed within the periphery 134, and an inactive area 138 is defined between the active area 136 and the periphery 134.

The ALL element 133 comprises an electrically conductive electrode or terminal 40 which is formed in the active area 36 adjacent to the first edge 134-1 and functions as a Field-Effect-Transistor (FET) source terminal. Another electrode or terminal 142 is formed in the active area 136 adjacent to the second edge 134-2 and functions as an FET drain terminal.

The ALL element 133 further comprises gates 148, 150 and 152 that are formed between the terminals 140 and 142. The gates 148, 150 and 152 are preferably insulated gates, each including a layer of insulating oxide with a layer of conductive metal formed over the oxide in a Metal-Oxide-Semiconductor (MOS) configuration.

Gate electrodes or terminals 154, 156 and 158 are formed in the inactive area 138 adjacent to the hexagon edges 34-6, 34-3 and 34-5 and are electrically connected to the gates 148, 150 and 152 respectively. In order to provide effective source-drain electrical isolation, the opposite end portions of each of the gates 148, 150 and 152 extend into the inactive area 138.

The ALL element 133 in its most basic form provides a logical AND function. The terminal 140 functions as a source terminal, whereas the terminal 142 functions as a drain terminal of a field effect transistor, with a channel being defined between the terminals 140 and 142.

Each gate 148, 150 and 152 controls the electrical conductivity of a respective underlying portion of the channel such that each gate 148, 150 and 152 can independently inhibit conduction through the channel. Signals must be applied to all of the gates 154, 156 and 158 which cause the underlying portions of the channel to become enhanced in order to enable conduction through the channel. This is an "ALL" or "AND" configuration.

The device 30 further includes an "ANY" element 233 having a hexagonal periphery 234 including first to sixth edges 234-1, 234-2, 234-3, 234-4, 234-5 and 234-6 respectively in the illustrated arrangement, and an active area 236. An inactive area 238 is defined between the active area 236 and the periphery 234.

The ANY element 233 comprises a central electrically conductive electrode or terminal 240 which functions as a Field-Effect-Transistor (FET) source terminal, and electrodes or terminals 242, 244 and 246 that are formed in the active area 236 adjacent to the first, second and third edges 234-1, 234-2 and 234-3 respectively.

The terminals 242, 244 and 246 function as FET drain terminals, and are preferably interconnected for operation. Although two each of the terminals 242, 244 and 246 are illustrated in the drawing, it is within the scope of the invention to provide one each, or more than two each of the terminals 242, 244 and 246.

The ANY element 233 further comprises gates 248, 250 and 252 that are formed between the terminals 242, 244 and 246 respectively and the central terminal 240. The gates 248, 250 and 252 are preferably insulated gates, each including a layer of insulating oxide with a layer of conductive metal formed over the oxide in a Metal-Oxide-Semiconductor (MOS) configuration.

In order to provide effective source-drain electrical isolation, the opposite end portions of each of the gates 248, 250 and 252 extend into the inactive area 238.

The device 30 has a CMOS configuration, with one of the elements 133,233 having a first conductivity type, and the other of the elements 133,233 having a second conductivity type which is opposite to the first conductivity type.

More specifically, one of the elements 133,233 will be N-channel (NMOS), and the other of the elements 133,233 will be P-channel (PMOS). One of the elements 133,233 will act as a pull-up element for the output of the device 30, whereas the other of the elements 133,233 will act as a pull-down element.

In order to minimize the area required on the substrate 32 by the device 30, the elements 133,233 are preferably closely packed, with the peripheries 134 and 234 having a common edge. As illustrated, the edge 134-4 of the element 133 is common with the edge 234-6 of the element 233.

The gates 248, 250 and 252 of the ANY element 233 are electrically connected to the gates 152, 150 and 148 of the ALL element such that the gates 248, 250 and 252 of the ANY element 233 are electrically connected to the gate terminals 158, 156 and 154 respectively. The inputs of the ALL element 133 and the ANY element 233 are thereby respectively interconnected. As will be described below, the outputs of the ALL element 133 and the ANY element 233 are also interconnected to provide a desired functionality.

The gates 152,248 and 148,252 are integrally formed, and extend across the inactive areas 138 and 238. An electrical conductor 253 connects the gate 250 to the terminal 156. Although the conductor 253 is illustrated as extending outside the peripheries 134 and 234 of the elements 133 and 233, it is within the scope of the invention to route the conductor 253 over the inactive areas 138 and 238 respectively.

The ANY element 233 in its most basic form provides a logical OR function. Each pair of drain terminals 242, 244 and 246 and respective gate 248, 250 and 252 forms a field effect transistor in combination with the common source terminal 240 such that each gate 248, 250 and 252 can independently establish a conduction channel between its respective drain and the source. This is an "ANY" or "OR" configuration.

Figure 3:
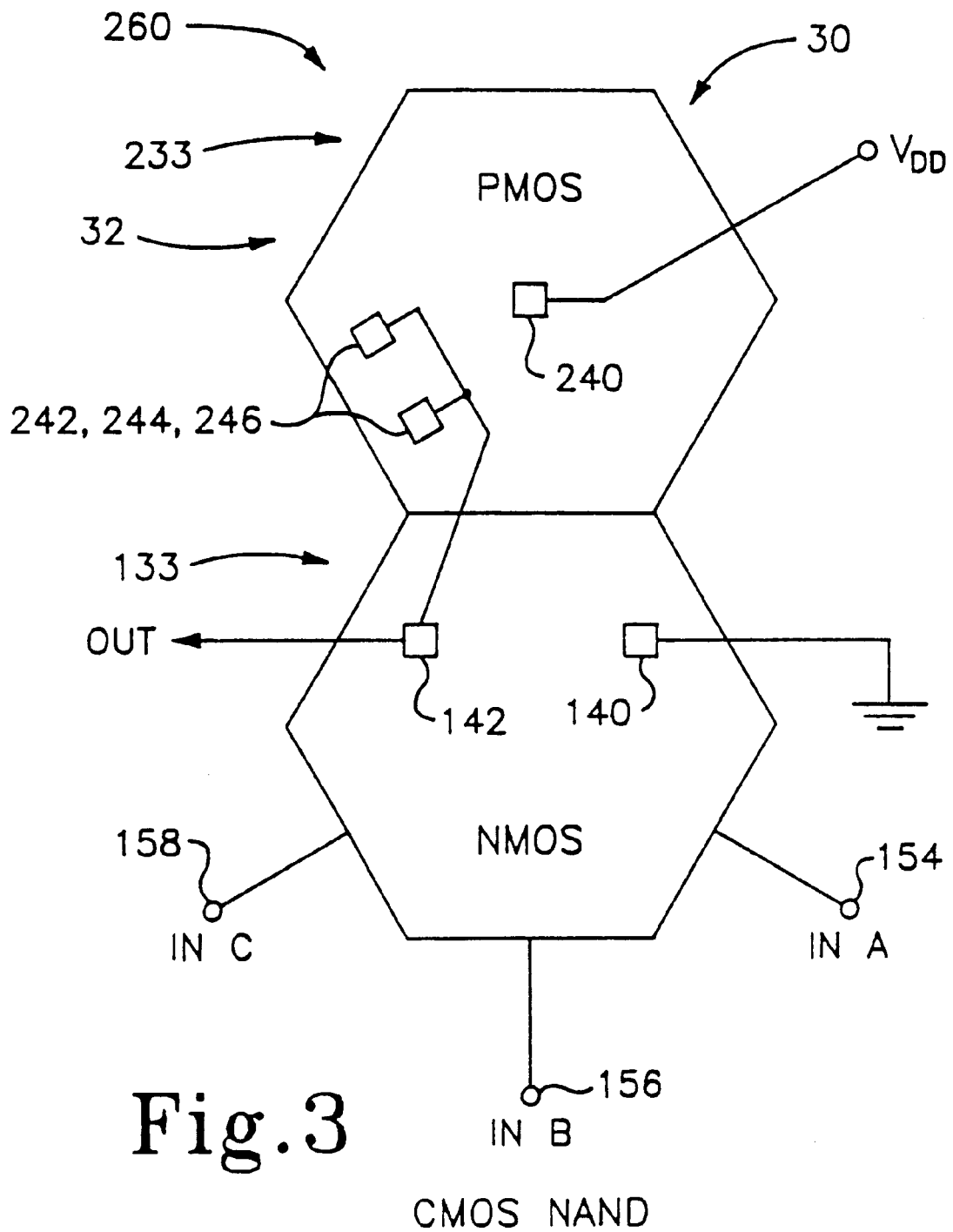
FIG. 3 is an electrical schematic diagram illustrating the present device connected to provide a logical NAND function.

A CMOS NAND gate 260 based on the device 30 is illustrated in FIG. 3. The device 30 is shown in simplified form for clarity of illustration, with only the hexagonal peripheries of the elements 133 and 233 and their terminals included in the drawing. The terminals 244 and 246 are not explicitly illustrated, and are assumed to be electrically connected to the terminals 242.

Input signals IN A, IN B and IN C are applied to the gate terminals 154, 156 and 158 respectively. A logically high signal will be assumed to be substantially equal to $V_{DD}$, and a logically low signal will be assumed to be substantially equal to ground, with $V_{DD}$ being more positive than ground.

The active area 236 of the ANY element 233 is N-type to provide PMOS operation. The central terminal 240 is connected to $V_{DD}$, whereas an output signal OUT is taken at the interconnected drain terminals 242, 244 and 246.

Any low input will establish a conductive channel between the terminals 242, 244 and 246 and the central terminal 240, thereby connecting the output to $V_{DD}$ and producing a high output signal OUT. When all of the inputs are high, the ANY element 233 is turned off and the terminals 242, 244 and 246 float.

The ANY element 233 thereby functions as a pull-up element of the CMOS NAND gate 260, in which any low input produces a high output.

The active area 136 of the ALL element 133 is P-type to provide NMOS operation. The source terminal 140 is connected to ground, and the drain terminal 142 is connected to the terminals 242, 244 and 246 of the ANY element 233 to provide a common output.

When any of the inputs are low, the ALL element 133 is turned off and the terminal 142 will float. If all of the inputs are high, a conductive channel will be established between the terminals 140 and 142 to connect the output to ground and produce a logically low output.

The ANY element 133 therefore functions as a pull-down element of the CMOS NAND gate 260, such that any low input produces a high output, and the output is low in response to all inputs being high.

Figure 4:
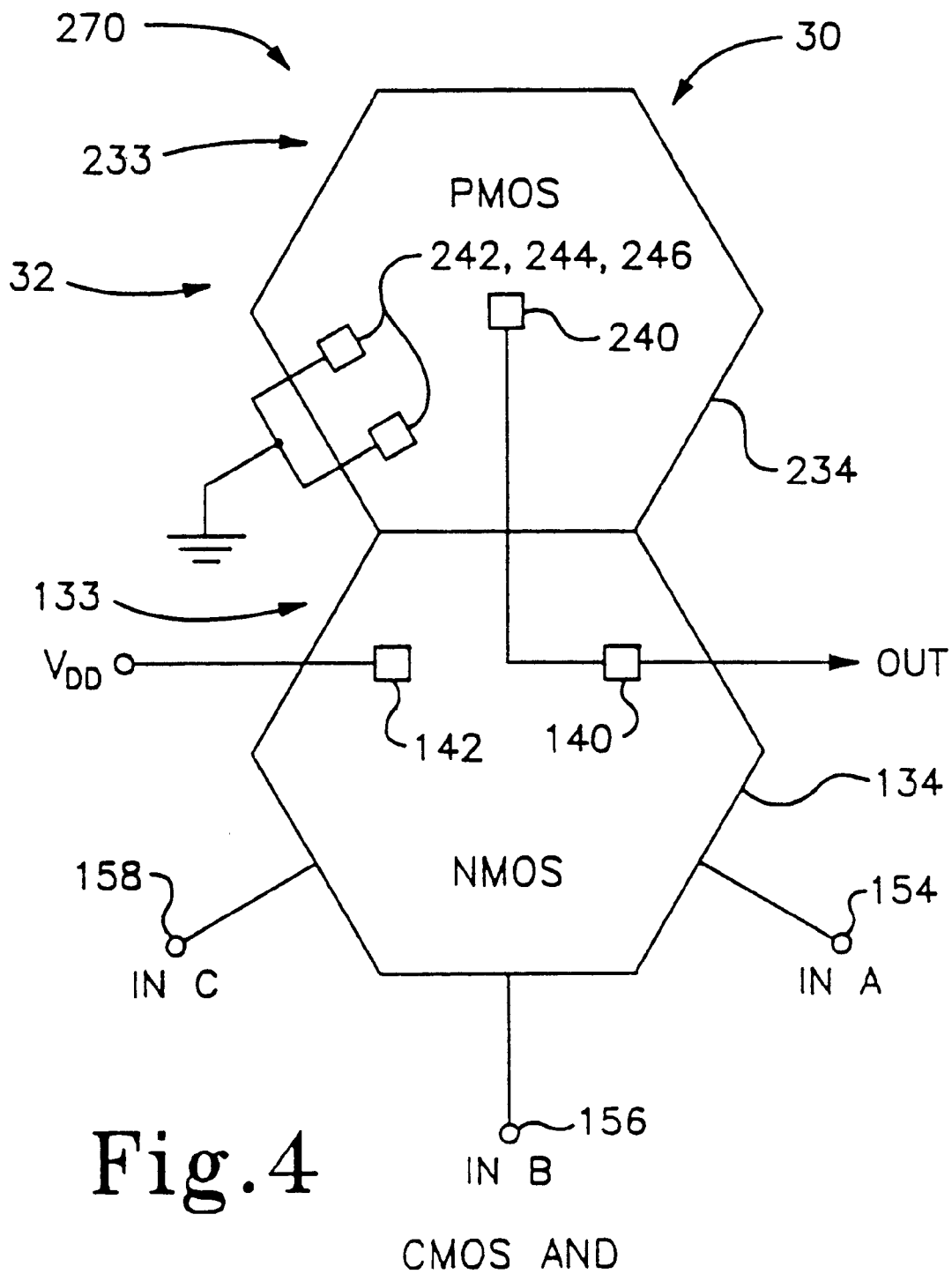
FIG. 4 is an electrical schematic diagram illustrating the gate device connected to provide a logical AND function.

A CMOS AND gate 270 incorporating the device 30 is illustrated in FIG. 4. The active area 236 of the ANY element 233 is N-type to provide PMOS FET operation, and the terminals 242, 244 and 246 are connected to ground. The output signal OUT appears at the central terminal 240.

Due to the PMOS configuration of the ANY element 233 in the AND gate 270, a logically low input signal IN A, IN B or IN C will establish a conductive channel between the terminals 242, 244 and 246 respectively and the central terminal 240. This connects the output to ground. When all of the inputs are high, the ANY element 233 is turned off, and the terminal 240 floats.

Thus, any low input will produce a low output, and the ANY element 233 acts as a pull-down element of the CMOS AND gate 270.

The active area 136 of the ALL element 133 is P-type to provide NMOS FET operation. The drain terminal 142 is connected to $V_{DD}$, and the terminal 140 is connected to the terminal 240 of the ANY element 233 to provide a common output OUT.

With any logically low input signal IN A, IN B and IN C applied to the gate terminal 154, 156 or 158 respectively, the ALL element 133 will be turned off and the terminal 140 will float.

Since the ALL element 133 provides NMOS operation in the configuration of FIG. 4, positive inputs to all of the gate terminals 154, 156 and 158 will establish a conductive channel between the terminals 140 and 242. The entire channel will be enhanced, thereby connecting the source terminal 140 to the potential $V_{DD}$ through the drain terminal 142 to produce a logically high output.

In this manner, the ALL element 133 acts as a pull-up element of the AND gate 270, such that the gate 270 produces a logically high output when all of the inputs are high, and a logically low output when any of the inputs are low.

Figure 5:
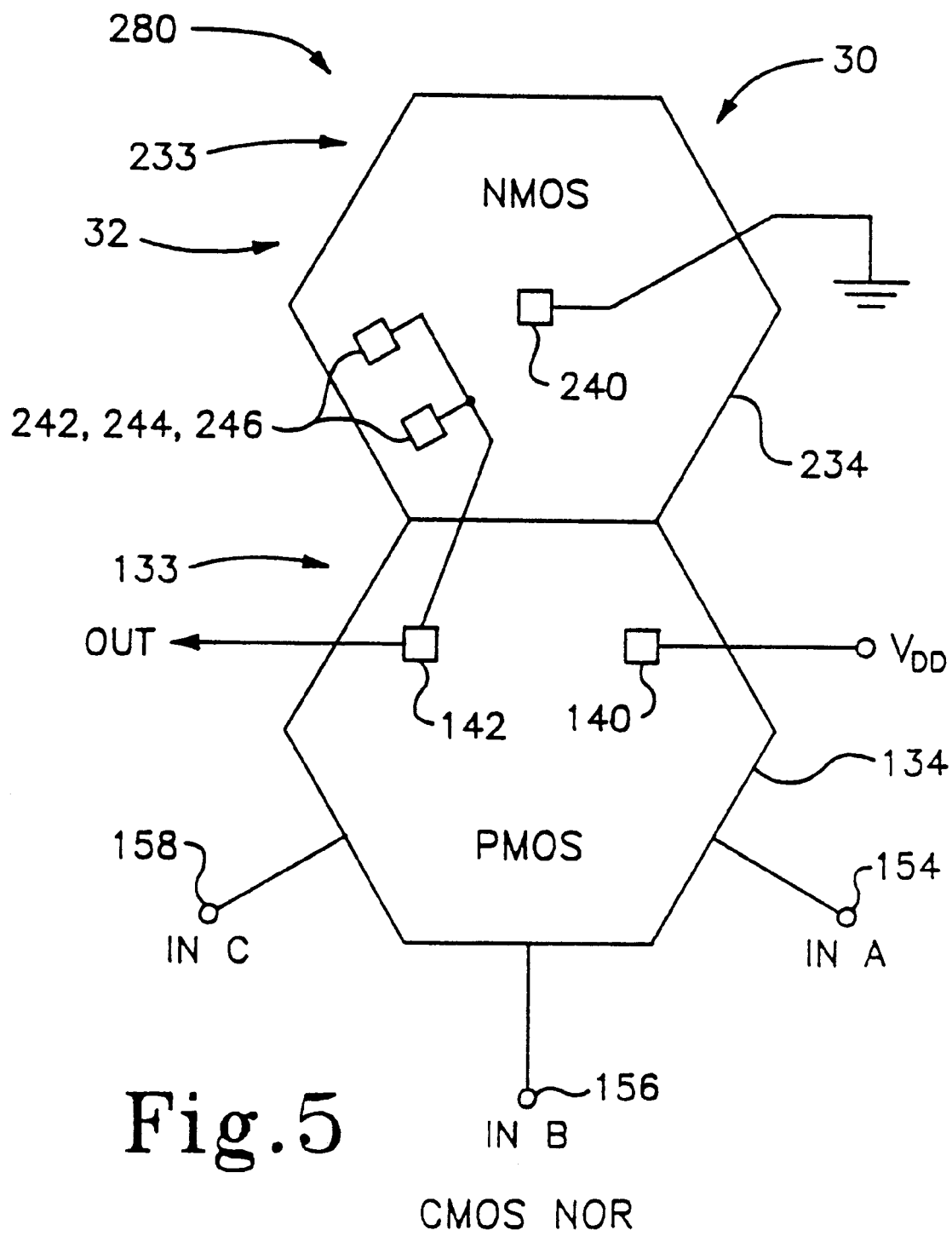
FIG. 5 is an electrical schematic diagram illustrating the gate device connected to provide a logical NOR function.

A NOR gate 280 incorporating the device 30 is illustrated in FIG. 5, in which the active area 236 of the ANY element 233 is P-type to provide NMOS operation. The central terminal 240 is connected to ground, and the terminals 242, 244 and 246 are connected to provide an output.

When all of the inputs are low, the ANY element 233 is turned off and the terminals 242, 244 and 246 will float. If any of the inputs is high, a conductive channel will be established between the respective terminals 242, 244 and 246 and the central terminal 240 to connect the terminals 242, 244 and 246 and thereby the output to ground to produce a logically low output.

In this manner, the ANY element 233 acts as a pull-down element of the CMOS NOR gate 280, with the output OUT being low if any or all inputs are high.

The active area 136 of the ALL element 133 is N-type to provide PMOS operation. The source terminal 140 is connected to $V_{DD}$, whereas the drain terminal 142 is connected to the output OUT.

All low inputs will establish a conductive channel between the terminals 140 and 142, thereby connecting the output to $V_{DD}$ and producing a high output. When any of the inputs are high, the ALL element 133 is turned off and the terminal 142 floats.

Thus, the NOR configuration is provided, in which the ALL element 133 acts as a pull-up element, any high input produces a low output, and the output is high in response to all inputs being low.

Figure 6:
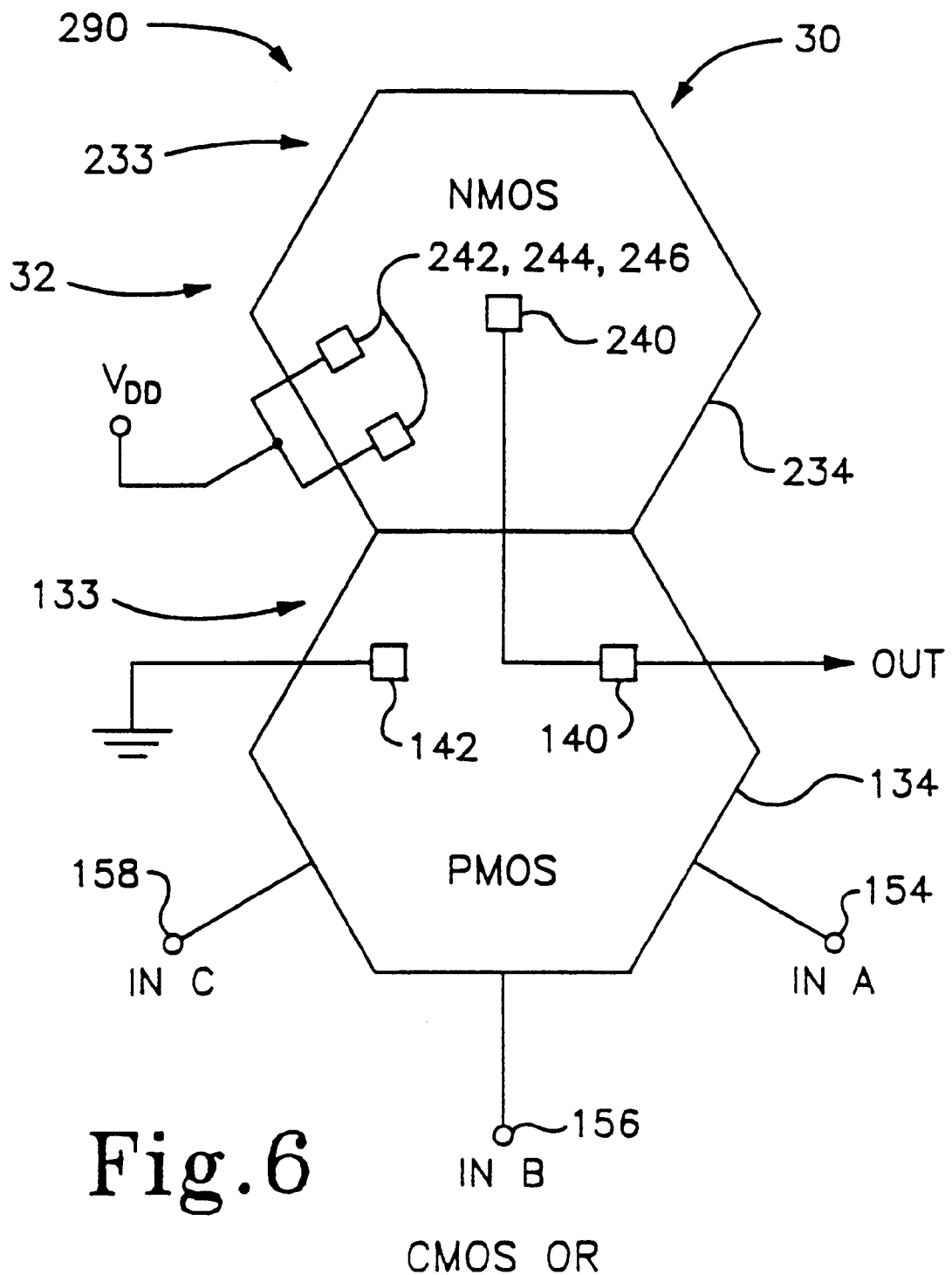
FIG. 6 is an electrical schematic diagram illustrating the gate device connected to provide a logical OR function.

A CMOS OR gate 290 based on the device 30 is illustrated in FIG. 6. The active area 236 of the ANY element 233 is P-type to provide NMOS FET operation. The terminals 242, 244 and 246 are connected to $V_{DD}$, whereas the terminal 40 is connected to provide an output.

With all logically low input signals applied to the gate terminals 254, 256 and 258 respectively, the ANY element 233 will be turned off and the terminals 242, 244 and 266 will float.

Since the device 30 provides NMOS operation in the configuration of FIG. 6, a positive input to any of the gate terminals 254, 256 and 258 will establish a conductive channel between the terminals 242, 244 and 246 respectively and the central terminal 240. Any one of these channels will connect the central terminal 240 to the potential $V_{DD}$ to produce a logically high output.

In this manner, the ANY element 233 acts as a pull-up element of the OR gate 290, and the output OUT is logically high when any or all of the inputs is high.

The active area 136 of the ANY element 133 is N-type to provide PMOS FET operation. The drain terminal 142 is connected to ground, and the source terminal 140 is connected to provide an output.

Due to the PMOS configuration of the ALL element 133 in the OR gate 290, all of the input signals must be logically low to establish a conductive channel between the terminals 140 and 142. This connects the output to ground.

Thus, the ANY element 133 acts as a pull-down element in the CMOS OR gate 290, and all low inputs will produce a low output.

The device 30 is illustrated as having three inputs, which is ideally suited to the hexagonal device shape. However, it is within the scope of the invention to provide a gate device having one or two inputs. A device with one input can be used as a buffer or an inverter.

The device 30 can be configured without modification to operate as if it had one or two, rather than three inputs. For example, if it is desired to operate the NAND gate 260 of FIG. 3 with only two inputs, the gate terminal 158 can be connected to $V_{DD}$ and the two inputs applied to the gate terminals 154 and 156. The NOR gate of FIG. 5 can be adapted to provide a two input configuration by connecting the gate terminal 158 to ground and applying the two inputs to the gate terminals 154 and 156.

It is also within the scope of the invention to modify the device 30 to have only one or two inputs by physically omitting one or two of the gates 148, 150 and 152 and respective terminals 142,144,146 and 154,156,158.

Figure 7:
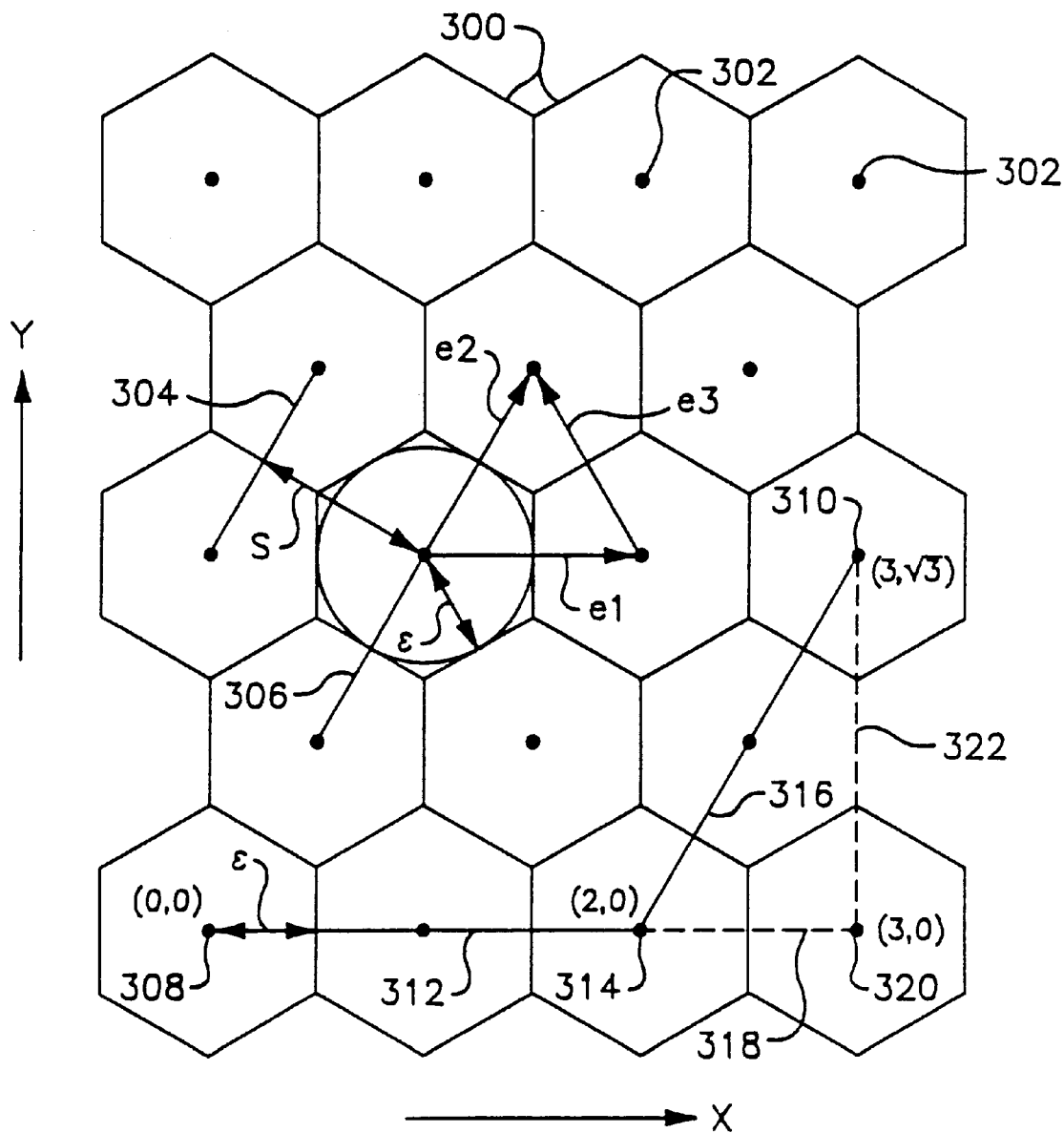
FIG. 7 is a diagram illustrating three direction routing for interconnecting the present devices based on hexagonal geometry in accordance with the present invention.

The geometry of a three directional hexagonal routing arrangement for interconnecting logic gates based on the present device 30 is illustrated in FIG. 7. An orthogonal coordinate system has an X axis and a Y axis. A closely packed pattern of small hexagons 300 is superimposed on the coordinate system, with the centers of the hexagons 300 being designated as terminal points 302.

For the purpose of the present disclosure, the term "closely packed" is construed to mean that the hexagons 300 are formed in a contiguous arrangement with adjacent hexagons 300 sharing common sides as illustrated, with no spaces being provided between adjacent hexagons 300. As will be described in detail below, logic gate devices based on the present device 30 are formed on the substrate 32 in a closely packed arrangement, witn each logic gate device covering a number of the small hexagons 300.

In accordance with the invention, the centers of the hexagons 300 as indicated at 302 represent interconnect points for terminals of the logic gate devices. Electrical conductors for interconnecting the points 302 extend in three directions that make angles of 60° relative to each other.

The conductors that extend in the three directions can be formed in three different layers, or alternatively the conductors that extend in two or three of the directions can be formed in a single layer as long as they do not cross.

As illustrated, a direction $e_1$ extends parallel to the X axis. A direction $e_2$ is rotated 60 degrees counterclockwise from the direction $e_1$, whereas a direction $e_3$ is rotated 120 degrees counterclockwise from the direction $e_1$. If the directions $e_1$, $e_2$ and $e_3$ are represented by vectors having a common length as illustrated in FIG. 7, they form an equilateral triangle. For convenience, the notation $e_1$, $e_2$ and $e_3$ is used to denote the vectors that extend in the respective routing directions as well as the directions themselves. The radius of the circles that are inscribed by the hexagons 300 is designated as $\epsilon$.

The vectors $e_1$, $e_2$ and $e_3$ can be defined using the following notation.

$$e_1 = (1, 0), e_2 = [(1/2), (\sqrt{3}/2)], e_3 = e_1 - e_2.$$

The geometric structure of the present invention can also be defined using set theory. A set $SIX(\alpha,\epsilon)$ of regular hexagons have centers at points $\alpha$, sides that are perpendicular to the vectors $e_1$, $e_2$ and $e_3$, and radii of inscribed circles equal to $\epsilon$ as described above. A set SU of points in a plane is denoted by $x_1 e_1 + x_2 e_2$, where $x_1$ and $x_2$ are integers.

The set $SIX(\alpha,\frac{1}{2})$ for all $\alpha$ from the set SU intersect only on the edges of the hexagons and partition the plane into the closely packed arrangement as illustrated. Circles inscribed in these hexagons are also densely packed.

As further illustrated in FIG. 7, the perpendicular distance S between two adjacent conductors extending in the direction $e_2$, such as conductors 304 and 306, is equal to $S = \sqrt{3}/2 = 0.87$ measured in X-Y coordinates, or $S = \sqrt{3}\epsilon = 1.73\epsilon$. The perpendicular distances between adjacent conductors extending in the other two directions $e_1$ and $e_2$ is the same as for the direction $e_2$.

An advantage of the present hexagonal routing arrangement is that the wirelength of conductors interconnecting two diagonally separated terminals is substantially less than with conventional rectilinear routing. As illustrated in FIG. 7, terminal points 308 and 310 to be interconnected are located at (x,y) coordinates (0,0) and (3,√3) respectively.

Using the present routing arrangement, the points 308 and 310 can be connected by a first conductor 312 extending in the direction $e_1$ from the point 310 to a point 314 at coordinates (2,0), and a second conductor 316 extending from the point 314 in the direction $e_2$ to the point 310. The length of each of the conductors 312 and 314 is 2, and the total connection length is 4.

Using the conventional rectilinear routing method, connection between the points 308 and 310 also requires the conductor 312 from the point 308 to the point 314. However, rather than the diagonal conductor 316, the conventional method requires two conductors, a conductor 318 from the point 314 to a point 320 at coordinates (3,0), and a conductor 322 from the point 320 to the point 310.

The combined length of the conductors 312 and 318 is 3, whereas the length of the conductor 322 is √3. The total length of the conventional rectilinear interconnect path is therefore 3+√3=4.73. The conventional path length between the points 308 and 310 is therefore 18.3% longer than the present path length.

The reduction of 18.3% in pathlength is approximately the average that is attained using the present hexagonal routing arrangement, although individual cases can vary from this value. However, the distance between any two points using rectilinear routing cannot be shorter than that using the present hexagonal routing in any case.

Figure 8:
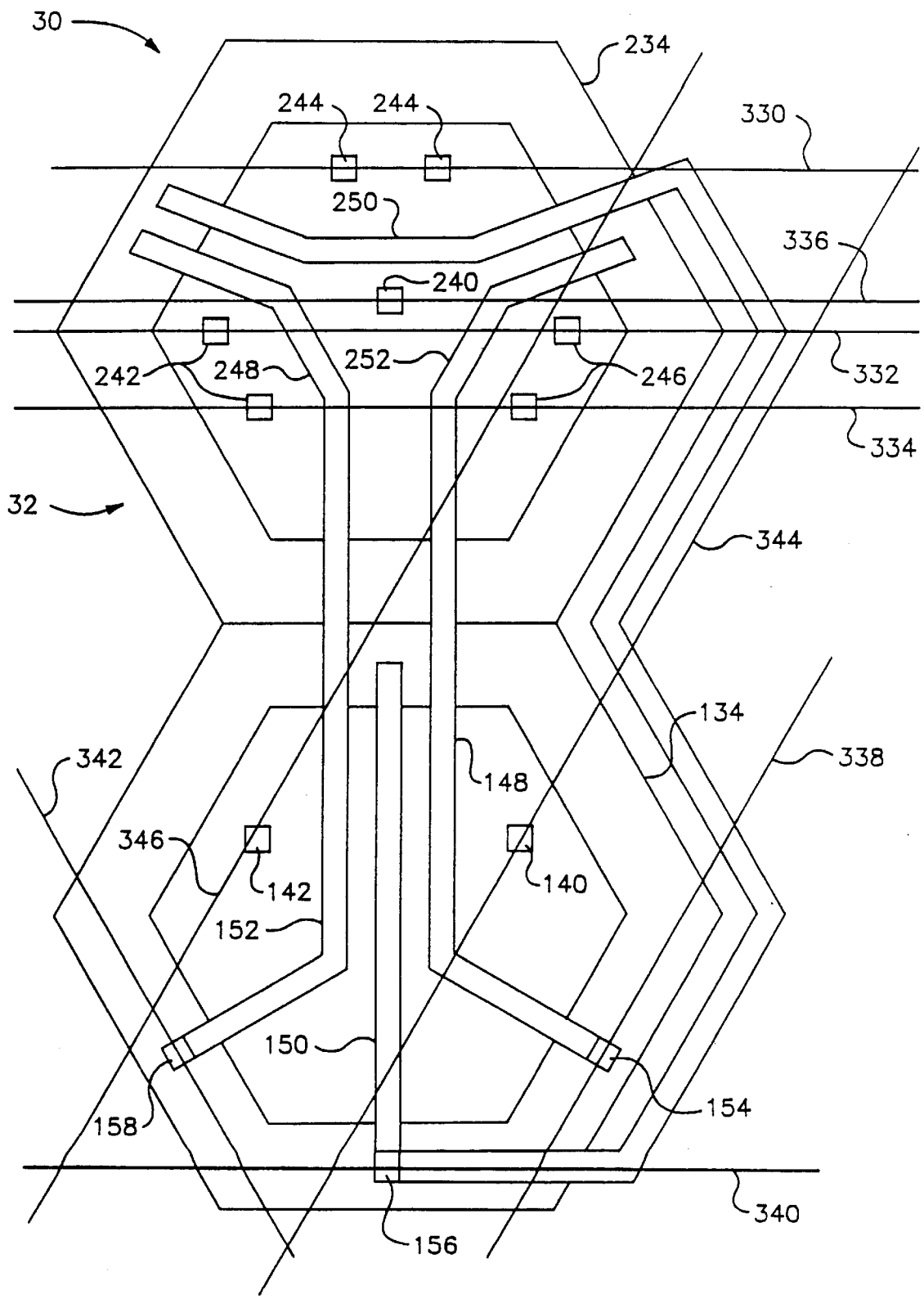
FIG. 8 is a diagram illustrating one device as connected using the three direction routing of FIG. 7.

An example of the device 30 as being interconnected using the hexagonal routing arrangement of FIG. 7 is illustrated in FIG. 8. It will be understood that the particular interconnect directions shown in the drawing are selected arbitrarily for illustrative purposes, and are not in any way limitative of the scope of the invention. In general, any of the wiring directions can be utilized to interconnect any of the elements of the device 30.

In the illustrated example, conductors 330, 332 and 334 that extend in the direction el are provided for interconnecting the drain terminals 242, 244 and 246 of the ANY element 233. A conductor 336 which also extends in the direction $e_1$ is provided for interconnecting the central terminal 240.

A conductor 338 which extends in the direction $e_2$ is provided for interconnection of the gate terminal 154 for the input IN A. A conductor 340 which extends in the direction $e_1$ provides interconnection of the gate terminal 156 for the input IN B, whereas a conductor 342 which extends in the direction $e_3$ provides interconnection of the gate terminal 158 for the input IN C. Conductors 344 and 346 which extend in the direction $e_2$ provide interconnection for the terminals 140 and 142 respectively.

The conductors 338, 340 and 342 are preferably provided in three separate wiring layers respectively. The conductors 330, 332 and 334 are preferably provided in another wiring layer or conductive plane, whereas the conductor 336 is preferably provided in yet another wiring layer or conductive plane.

Figure 9:
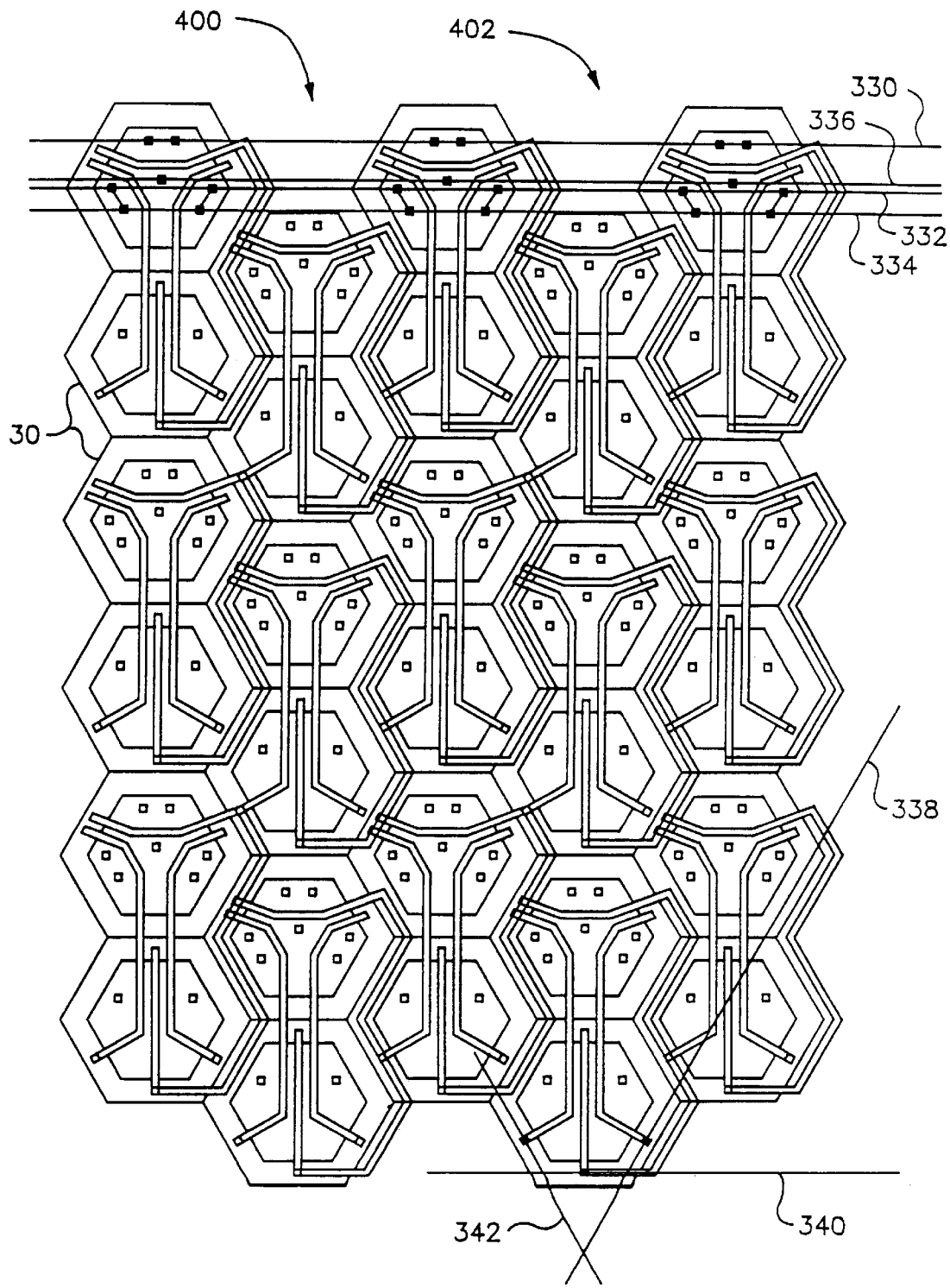
FIG. 9 is a diagram illustrating a microelectronic integrated circuit including a plurality of the present gate devices in a closely packed hexagonal arrangement.

FIG. 9 illustrates a microelectronic integrated circuit 400 according to the present invention comprising a semiconductor substrate 402 on which a plurality of the devices 30 are formed in a closely packed hexagonal arrangement. Further shown are a few illustrative examples of interconnection of the devices using the conductors 330 to 346 that extend in the three directions $e_1$, $e_2$ and $e_3$.

It will be understood from the above description that the present gate device geometry and three direction interconnect arrangement substantially reduce the total wirelength interconnect congestion of the integrated circuit by providing three routing directions, rather than two as in the prior art. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

Various modifications will become possible for those skilled in the art after receiving the teachings of the present disclosure without departing from the scope thereof.

For example, it will be understood that the terms "source" and "drain" as applied to field effect transistors merely define opposite ends of a channel region which is controlled by a voltage applied to a gate. The source and drain are interchangeable in that current may flow into either one and out of the other.

Therefore, the terms "source" and "drain", and the relative polarities of voltages applied thereto, as used in the present specification, are arbitrary and reversible within the scope of the invention, and are not to be considered as limiting the invention to one or the other of the possible configurations of polarities.

Figure 10:
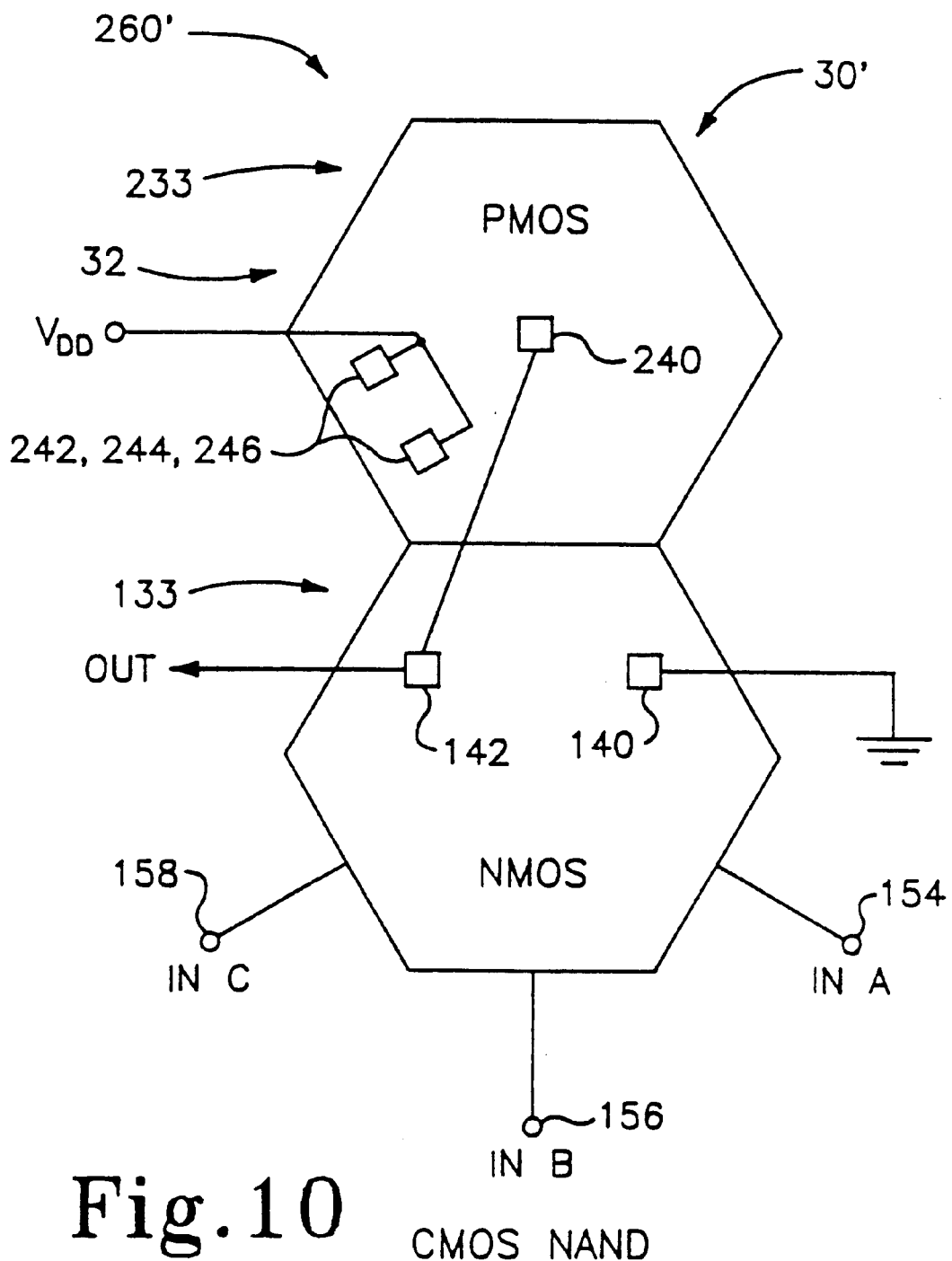
FIG. 10 is a diagram illustrating the gate device connected to provide a logical NAND function with reversed source and drain connections.

For example, FIG. 10 illustrates a modified CMOS NAND gate 260' based on a device 30' which differs from the NAND gate 260 of FIG. 3 in that the source and drain terminals of the ANY element 233 are reversed relative to each other.

In this embodiment of the invention, the terminals 242, 244 and 246 constitute sources and are connected to $V_{DD}$, whereas the center terminal 240 constitutes the drain and is connected to the output in parallel with the terminal 142 of the ALL element 133.

Although not explcitly illustrated, this modification is equally applicable to all other embodiments of the invention.

I claim:

1. A CMOS microelectronic device, comprising:
    a hexagonal ANY element of a first conductivity type, having a first input and an output; and
    a hexagonal ALL element of a second conductivity type which is opposite to said first conductivity type, having a first input and an output, in which:
    said first inputs of the ANY and ALL elements are electrically interconnected, and said outputs of the ANY and ALL elements are electrically interconnected;
    the ANY element has a periphery defined by a hexagon including first through sixth edges;
    the ALL element has a periphery defined by a hexagon including first through sixth edges; and
    one of said first through sixth edges of the ANY element is common with one of said first through sixth edges of the ALL element.

2. A device as in claim 1, in which the ANY element comprises:
    an active area formed within said periphery;
    a central terminal formed in a central portion of said active area;
    a first terminal formed adjacent to said first edge in said active area; and
    a first gate which is formed between said first terminal and said central terminal and is electrically connected to said first input.

3. A device as in claim 2, in which the ANY element further comprises:
    a second terminal formed adjacent to said second edge in said active area; and
    a second gate formed between said second terminal and said central terminal.

4. A device as in claim 3, in which said first edge and said second edge are separated by said fourth edge.

5. A device as in claim 3, in which the ANY element further comprises:
    a third terminal formed adjacent to said third edge in said active area; and
    a third gate formed between the third terminal and the central terminal.

6. A device as in claim 5, in which said first edge and said second edge are separated by said fourth edge, said second edge and said third edge are separated by said fifth edge, and said third edge and said first edge are separated by said sixth edge.

7. A device as in claim 6, in which the ANY element further comprises an inactive area disposed between said active area and said periphery.

8. A device as in claim 7, in which the ANY element further comprises first, second and third gate terminals which are formed in said inactive area adjacent to said fourth, fifth and sixth edges and are connected to the first, second and third gates respectively.

9. A device as in claim 8, in which:
    the central terminal constitutes a source terminal; and
    the first, second and third terminals constitute drain terminals.

10. A device as in claim 2, in which the first gate comprises:
    an insulating oxide layer formed over the substrate; and
    a conductive metal layer formed over the oxide layer.

11. A device as in claim 2, in which:
    the ANY element further comprises an inactive area disposed between said active area and said periphery; and
    the first gate has opposite end portions that extend into said inactive area.

12. A device as in claim 1, in which the ALL element comprises:
    an active area formed within said periphery;
    a first terminal formed adjacent to said first edge in said active area;
    a second terminal formed adjacent to said second edge in said active area; and
    a first gate formed between the first terminal and the second terminal.

13. A device as in claim 12, in which the ALL element further comprises a second gate formed between the first gate and the second terminal.

14. A device as in claim 13, in which said first edge and said second edge are separated by said fourth edge.

15. A device as in claim 13, in which the ALL element further comprises a third gate formed between the second gate and the second terminal.

16. A device as in claim 15, in which said first edge and said second edge are separated by said fourth edge, said second edge and said third edge are separated by said fifth edge, and said third edge and said first edge are separated by said sixth edge.

17. A device as in claim 16, in which the ALL element further comprises an inactive area disposed between said active area and said periphery.

18. A device as in claim 17, in which the ALL element further comprises first, second and third gate terminals that are formed in said inactive area adjacent to said third, fifth and sixth edges and are connected to the first, second and third gates respectively.

19. A device as in claim 18, in which:
the first terminal constitutes a source terminal; and
the second terminal constitutes a drain terminal.

20. A device as in claim 12, in which the first gate comprises:
an insulating oxide layer formed over the substrate; and
a conductive metal layer formed over the oxide layer.

21. A device as in claim 12, in which the ALL element further comprises an inactive area disposed between said active area and said periphery, in which the first gate has opposite end portions that extend into said inactive area.

22. A device as in claim 1, in which:
said first conductivity type is P-type;
the ANY element further comprises:
a second terminal formed adjacent to said second edge in said active area thereof; and
a second gate which is formed between said second terminal and said central terminal and is electrically connected to a second input thereof;
the central terminal of the ANY element constitutes a source terminal and is connected to a first electrical potential;
the first and second terminals of the ANY element constitute drain terminals and are connected to said output thereof;
said second conductivity type is N-type;
the ALL element further comprises a second gate which is formed between the first gate and the second terminal and is electrically connected to a second input thereof:
the first terminal of the ALL element constitutes a source terminal and is connected to a second electrical potential which is lower than said first electrical potential;
the second terminal of the ALL element constitutes a drain terminal and is connected to said output thereof; and
said second inputs of the ANY and ALL elements are electrically interconnected, such that the device provides a NAND function.

23. A device as in claim 1, in which:
said first conductivity type is P-type;
the ANY element further comprises:
a second terminal formed adjacent to said second edge in said active area thereof; and
a second gate which is formed between said second terminal and said central terminal and is electrically connected to a second input thereof;
the central terminal of the ANY element constitutes a source terminal and is connected to said output thereof;
the first and second terminals of the ANY element constitute drain terminals and are connected to a first electrical potential;
said second conductivity type is N-type;
the ALL element further comprises a second gate which is formed between the first gate and the second terminal and is electrically connected to a second input thereof:
the first terminal of the ALL element constitutes a source terminal and is connected to said output thereof;
the second terminal of the ALL element constitutes a drain terminal and is connected to a second electrical potential which is higher than said first electrical potential; and
said second inputs of the ANY and ALL elements are electrically interconnected, such that the device provides an AND function.

24. A device as in claim 1, in which:
said first conductivity type is N-type;
the ANY element further comprises:
a second terminal formed adjacent to said second edge in said active area thereof; and
a second gate which is formed between said second terminal and said central terminal and is electrically connected to a second input thereof;
the central terminal of the ANY element constitutes a source terminal and is connected to a first electrical potential;
the first and second terminals of the ANY element constitute drain terminals and are connected to said output thereof;
said second conductivity type is P-type;
the ALL element further comprises a second gate which is formed between the first gate and the second terminal and is electrically connected to a second input thereof:
the first terminal of the ALL element constitutes a source terminal and is connected to a second electrical potential which is higher than said first electrical potential;
the second terminal of the ALL element constitutes a drain terminal and is connected to said output thereof; and
said second inputs of the ANY and ALL elements are electrically interconnected, such that the device provides a NOR function.

25. A device as in claim 1, in which:
said first conductivity type is N-type;
the ANY element further comprises:
a second terminal formed adjacent to said second edge in said active area thereof; and
a second gate which is formed between said second terminal and said central terminal and is electrically connected to a second input thereof;
the central terminal of the ANY element constitutes a source terminal and is connected to said output thereof;
the first and second terminals of the ANY element constitute drain terminals and are connected to a first electrical potential;
said second conductivity type is P-type;
the ALL element further comprises a second gate which is formed between the first gate and the second terminal and is electrically connected to a second input thereof:
the first terminal of the ALL element constitutes a source terminal and is connected to said output thereof;
the second terminal of the ALL element constitutes a drain terminal and is connected to a second electrical potential which is lower than said first electrical potential; and
said second inputs of the ANY and ALL elements are electrically interconnected, such that the device provides an OR function.

26. A microelectronic integrated circuit, comprising:

a semiconductor substrate; and a plurality of CMOS microelectronic devices formed on the substrate, each device including:

a hexagonal ANY element of a first conductivity type, having a first input and an output; and a hexagonal ALL element of a second conductivity type which is opposite to said first conductivity type, having a first input and an output, in which:

said first inputs of the ANY and ALL elements are electrically interconnected, and said outputs of the ANY and ALL elements are electrically interconnected;

the ANY element has a periphery defined by a hexagon including first through sixth edges;

the ALL element has a periphery defined by a hexagon including first through sixth edges; and one of said first through sixth edges of the ANY element is common with one of said first through sixth edges of the ALL element.

27. An integrated circuit as in claim 26, in which the ANY element comprises:

an active area formed within said periphery;

a central terminal formed in a central portion of said active area;

a first terminal formed adjacent to said first edge in said active area; and a first gate which is formed between said first terminal and said central terminal and is electrically connected to said first input.

28. An integrated circuit as in claim 27, in which the ANY element further comprises:

a second terminal formed adjacent to said second edge in said active area; and a second gate formed between said second terminal and said central terminal.

29. An integrated circuit as in claim 28, in which said first edge and said second edge are separated by said fourth edge.

30. An integrated circuit as in claim 28, in which the ANY element further comprises:

a third terminal formed adjacent to said third edge in said active area; and a third gate formed between the third terminal and the central terminal.

31. An integrated circuit as in claim 30, in which said first edge and said second edge are separated by said fourth edge, said second edge and said third edge are separated by said fifth edge, and said third edge and said first edge are separated by said sixth edge.

32. An integrated circuit as in claim 31, in which the ANY element further comprises an inactive area disposed between said active area and said periphery.

33. An integrated circuit as in claim 32, in which the ANY element further comprises first, second and third gate terminals which are formed in said inactive area adjacent to said third, fifth and sixth edges and are connected to the first, second and third gates respectively.

34. An integrated circuit as in claim 33, in which:

the central terminal constitutes a source terminal; and the first, second and third terminals constitute drain terminals.

35. An integrated circuit as in claim 27, in which the first gate comprises:

an insulating oxide layer formed over the substrate; and a conductive metal layer formed over the oxide layer.

36. An integrated circuit as in claim 27, in which:

the ANY element further comprises an inactive area disposed between said active area and said periphery; and the first gate has opposite end portions that extend into said inactive area.

37. An integrated circuit as in claim 26, in which the ALL element comprises:

an active area formed within said periphery;

a first terminal formed adjacent to said first edge in said active area;

a second terminal formed adjacent to said second edge in said active area; and a first gate formed between the first terminal and the second terminal.

38. An integrated circuit as in claim 37, in which the ALL element further comprises a second gate formed between the first gate and the second terminal.

39. An integrated circuit as in claim 38, in which said first edge and said second edge are separated by said fourth edge.

40. An integrated circuit as in claim 38, in which the ALL element further comprises a third gate formed between the second gate and the second terminal.

41. An integrated circuit as in claim 40, in which said first edge and said second edge are separated by said fourth edge, said second edge and said third edge are separated by said fifth edge, and said third edge and said first edge are separated by said sixth edge.

42. An integrated circuit as in claim 41, in which the ALL element further comprises an inactive area disposed between said active area and said periphery.

43. An integrated circuit as in claim 42, in which the ALL element further comprises first, second and third gate terminals that are formed in said inactive area adjacent to said fourth, fifth and sixth edges and are connected to the first, second and third gates respectively.

44. An integrated circuit as in claim 43, in which:

the first terminal constitutes a source terminal; and the second terminal constitutes a drain terminal.

45. An integrated circuit as in claim 37, in which the first gate comprises:

an insulating oxide layer formed over the substrate; and a conductive metal layer formed over the oxide layer.

46. An integrated circuit as in claim 37, in which the ALL element further comprises an inactive area disposed between said active area and said periphery, in which the first gate has opposite end portions that extend into said inactive area.

47. An integrated circuit as in claim 26, in which:

said first conductivity type is P-type;

the ANY element further comprises:

a second terminal formed adjacent to said second edge in said active area thereof; and a second gate which is formed between said second terminal and said central terminal and is electrically connected to a second input thereof;

the central terminal of the ANY element constitutes a source terminal and is connected to a first electrical potential;

the first and second terminals of the ANY element constitute drain terminals and are connected to said output thereof;

said second conductivity type is N-type;

the ALL element further comprises a second gate which is formed between the first gate and the second terminal and is electrically connected to a second input thereof;

the first terminal of the ALL element constitutes a source terminal and is connected to a second electrical potential which is lower than said first electrical potential;

the second terminal of the ALL element constitutes a drain terminal and is connected to said output thereof; and said second inputs of the ANY and ALL elements are electrically interconnected, such that the device provides a NAND function.

48. An integrated circuit as in claim 26, in which:

said first conductivity type is P-type;

the ANY element further comprises:
  a second terminal formed adjacent to said second edge in said active area thereof; and
  a second gate which is formed between said second terminal and said central terminal and is electrically connected to a second input thereof;

the central terminal of the ANY element constitutes a source terminal and is connected to said output thereof;

the first and second terminals of the ANY element constitute drain terminals and are connected to a first electrical potential;

said second conductivity type is N-type;

the ALL element further comprises a second gate which is formed between the first gate and the second terminal and is electrically connected to a second input thereof:

the first terminal of the ALL element constitutes a source terminal and is connected to said output thereof;

the second terminal of the ALL element constitutes a drain terminal and is connected to a second electrical potential which is higher than said first electrical potential; and said second inputs of the ANY and ALL elements are electrically interconnected, such that the device provides an AND function.

49. An integrated circuit as in claim 26, in which:

said first conductivity type is N-type;

the ANY element further comprises:
  a second terminal formed adjacent to said second edge in said active area thereof; and
  a second gate which is formed between said second terminal and said central terminal and is electrically connected to a second input thereof;

the central terminal of the ANY element constitutes a source terminal and is connected to a first electrical potential;

the first and second terminals of the ANY element constitute drain terminals and are connected to said output thereof;

said second conductivity type is P-type;

the ALL element further comprises a second gate which is formed between the first gate and the second terminal and is electrically connected to a second input thereof:

the first terminal of the ALL element constitutes a source terminal and is connected to a second electrical potential which is higher than said first electrical potential;

the second terminal of the ALL element constitutes a drain terminal and is connected to said output thereof; and said second inputs of the ANY and ALL elements are electrically interconnected, such that the device provides a NOR function.

50. An integrated circuit as in claim 26, in which:

said first conductivity type is N-type;

the ANY element further comprises:
  a second terminal formed adjacent to said second edge in said active area thereof; and
  a second gate which is formed between said second terminal and said central terminal and is electrically connected to a second input thereof;

the central terminal of the ANY element constitutes a source terminal and is connected to said output thereof;

the first and second terminals of the ANY element constitute drain terminals and are connected to a first electrical potential;

said second conductivity type is P-type;

the ALL element further comprises a second gate which is formed between the first gate and the second terminal and is electrically connected to a second input thereof:

the first terminal of the ALL element constitutes a source terminal and is connected to said output thereof;

the second terminal of the ALL element constitutes a drain terminal and is connected to a second electrical potential which is lower than said first electrical potential; and said second inputs of the ANY and ALL elements are electrically interconnected, such that the device provides an OR function.

* * * * *